United States Patent
Aso et al.

(10) Patent No.: US 8,047,095 B2
(45) Date of Patent: Nov. 1, 2011

(54) XY TABLE ACTUATOR

(75) Inventors: Toshiyuki Aso, Tokyo (JP); Yoshihiro Kimura, Tokyo (JP)

(73) Assignee: THK Co., Ltd., Tokyo (JP)

( * ) Notice: Subject to any disclaimer, the term of this patent is extended or adjusted under 35 U.S.C. 154(b) by 518 days.

(21) Appl. No.: 12/095,971

(22) PCT Filed: Nov. 20, 2006

(86) PCT No.: PCT/JP2006/323116
§ 371 (c)(1),
(2), (4) Date: Apr. 1, 2009

(87) PCT Pub. No.: WO2007/066501
PCT Pub. Date: Jun. 14, 2007

(65) Prior Publication Data
US 2010/0024587 A1    Feb. 4, 2010

(30) Foreign Application Priority Data

Dec. 6, 2005 (JP) .................. 2005-352378
Jun. 30, 2006 (JP) .................. 2006-181682

(51) Int. Cl.
G05G 11/00 (2006.01)
(52) U.S. Cl. .................................... 74/490.09
(58) Field of Classification Search ............. 74/490.09
See application file for complete search history.

(56) References Cited

U.S. PATENT DOCUMENTS

| | | | |
|---|---|---|---|
| 4,896,869 A * | 1/1990 | Takekoshi | 269/60 |
| 5,613,403 A * | 3/1997 | Takei | 74/490.09 |
| 5,724,893 A * | 3/1998 | Lee et al. | 108/20 |
| 7,883,077 B2 * | 2/2011 | Knoth | 269/58 |
| 2007/0119347 A1 * | 5/2007 | Yamazaki et al. | 108/20 |
| 2008/0043325 A1 * | 2/2008 | Ue et al. | 359/393 |

FOREIGN PATENT DOCUMENTS

| | | |
|---|---|---|
| JP | 59-24226 U | 2/1984 |
| JP | 1-106136 U | 7/1989 |
| JP | 05-18415 A | 1/1993 |
| JP | 9-184517 A | 7/1997 |

OTHER PUBLICATIONS

International Search Report of PCT/JP2006/323116, date of mailing Jan. 30, 2007.

* cited by examiner

*Primary Examiner* — Raymond Addie
(74) *Attorney, Agent, or Firm* — Westerman, Hattori, Daniels & Adrian, LLP

(57) ABSTRACT

Provided is an XY table actuator that, while building-in a drive means for freely moving an object placed on a table within an XY-plane and positioning the object, can be significantly reduced in size and that helps to suppress an increase in table height. The actuator has: a stationary plate (2) having a receiving groove extending in an X-direction; a moving plate (5) having a receiving groove extending in a Y-direction; an intermediate plate (4) whose lower body is assembled to the receiving groove (20) of the stationary plate (2) through intermediation of rolling bodies (3), whose upper body is assembled to the receiving groove of the moving plate (5) through intermediation of rolling bodies (3), and which is movable in the X-direction with respect to the stationary plate, with the moving plate being movable in the Y-direction with respect to the intermediate plate; an X-drive means (6) for propelling the intermediate plate in the X-direction with respect to the stationary plate; and a Y-drive means (7) for propelling the moving plate in the Y-direction with respect to the intermediate plate, in which the intermediate plate is provided with receiving chambers (40, 41) for the X-drive means and the Y-drive means, respectively.

9 Claims, 10 Drawing Sheets

XY TABLE ACTUATOR

TECHNICAL FIELD

The present invention relates to an XY table actuator which is used in various types of inspection apparatus, measurement apparatus, conveyance apparatus, and the like, and which is adapted to move an object freely within an XY-plane to perform positioning thereon, and more specifically, to an XY table actuator allowing a reduction in thickness to approximately 10 mm.

BACKGROUND ART

Conventionally, a so-called built-up type XY table actuator utilizing a linear guide has been known as an apparatus for moving an object freely within the XY-plane to perform positioning thereon at an arbitrary position. More specifically, a track rail extending in the X-direction is arranged on a stationary portion such as a bed or a column, and there is provided a lower table moving along this track rail. Further, a track rail extending in the Y-direction is arranged on the lower table, and there is provided an upper table moving along this track rail; and the upper table is moved freely in the X-direction and the Y-direction with respect to the stationary portion. As means for causing the lower table to advance and retreat in the Y-direction with respect to the stationary portion and for causing the upper table to advance and retreat in the X-direction with respect to the lower table, there is known one which converts the rotary motion of a motor to a linear motion by a ball screw and which transmits the linear movement to the lower table or the upper table.

In the XY table actuator constructed as described above, a load of a linear guide device supporting movement of the lower table and the upper table is arbitrarily selected, whereby the XY table actuator is flexibly applicable to various uses from small load uses to large load uses. Further, through appropriate selection of a length of the track rail, it is also possible to elongate a stroke amount of the upper table. However, since the track rail in the Y-direction is arranged on the lower table, which is movable in the X-direction, high rigidity is required of the lower table itself. Further, the height of the XY table actuator as measured from the stationary portion to the upper table cannot but be rather large, resulting in an increase in size and weight of the entire tables.

JP 05-18415 A discloses an XY table in which a reduction in size and weight is achieved through press working of a thin steel plate. More specifically, end portions of steel plates are bent and raised by press working to thereby form a lower plate and an upper plate of a channel-like configuration. Further, there is formed an intermediate plate in which, of its four sides, two opposing sides are bent downwardly and remaining two sides are bent upwardly, with the upper plate, the intermediate plate, and the lower plate being combined with each other such that side wall portions formed by bending are opposed to each other. Balls are arranged between the side wall portions opposed to each other, and the balls roll on the side wall portions, whereby the intermediate plate can move in the X-direction with respect to the lower plate, and the upper plate can move freely in the Y-direction with respect to the intermediate plate. In this XY table, the lower plate and the upper plate may be completely of the same structure although they differ in moving direction with respect to the intermediate plate, thus advantageously helping to achieve a reduction in production cost. Patent Document 1: JP 05-18415 A

DISCLOSURE OF THE INVENTION

Problems to be Solved by the Invention

However, in the XY table disclosed in JP 05-18415 A, there is provided no drive means for causing the upper plate to advance and retreat with respect to the lower plate and performing positioning thereon. When, for example, positioning is to be performed on an object of conveyance placed on the upper plate at an arbitrary position within the XY-plane, it is necessary to separately provide drive means. Thus, as an XY table actuator for performing positioning on an upper plate at an arbitrary position within the XY-plane, it makes no contribution to a reduction in size and weight.

On the other hand, in the case of the so-called built-up type XY table actuator described above, it might be possible to provide on the lower plate means for causing the intermediate plate to advance and retreat in the X-direction with respect to the lower plate, and to provide on the intermediate plate means for causing the upper plate to advance and retreat in the Y-direction with respect to the intermediate plate. However, that would make it necessary to impart a structure to the lower plate which is different from that of the upper plate. Thus, it would be impossible to achieve a reduction in production cost through adoption of the structure for the upper plate and the lower plate.

Further, the provision of a drive means respectively on each of the lower plate and the intermediate plate has a problem in that separate signal line wiring for the drive means is necessary for those plates, with the result that the installation of the XY table actuator requires time and effort.

Means for Solving the Problems

The present invention has been made in view of the above-mentioned problems in the related art. It is an object of the present invention to provide an XY table actuator which, while building-in a drive means for freely moving an object placed on a table within an XY-plane and positioning the object, can achieve a marked reduction in size and which helps to suppress an increase in table height.

The XY table actuator of the present invention is equipped with a stationary plate having a receiving groove extending in an X-direction and formed in a substantially channel-like configuration, a moving plate having a receiving groove extending in a Y-direction and formed in a substantially channel-like configuration, and an intermediate plate movable in the X-direction with respect to the stationary plate and in the Y-direction with respect to the moving plate. A lower body of the intermediate plate is assembled to the receiving groove of the stationary plate through the intermediation of rolling bodies, while an upper body thereof is assembled to the receiving groove of the moving plate through the intermediation of rolling bodies. The stationary plate and the moving plate only differ in their attitude when combined with the intermediate plate. In terms of structure, they may be completely the same.

Further, an XY table actuator according to the present invention includes: an X-drive means for propelling the stationary plate in the X-direction; and a Y-drive means for propelling the moving plate in the Y-direction. The intermediate plate is provided with receiving chambers for the X-drive means and the Y-drive means, respectively.

The lower body of the intermediate plate is assembled to the receiving groove of the stationary plate, and the upper body thereof is assembled to the receiving groove of the moving plate, so the thickness of the intermediate plate is sufficiently larger than that of the stationary plate or the moving plate. Thus, the receiving chambers are provided in the intermediate plate, and the X-drive means and Y-drive means are accommodated in the receiving chambers, whereby it is possible to incorporate the pair of drive means into the XY table actuator. Yet it is possible to realize an XY table actuator of a size equivalent to that of a simple XY table equipped with no drive means.

When the receiving chambers for the X-drive means and the Y-drive means are provided in the intermediate plate, there is no need to fix the X-drive means and the Y-drive means to the intermediate plate. For example, it is possible to adopt a construction in which the X-drive means mounted on the stationary plate is accommodated in a receiving chamber of the intermediate plate. It should be noted, however, that, when the X-drive means and the Y-drive means are fixed to the intermediate plate, it is possible to collectively lead the signal lines of those drive means out of the intermediate plate, thereby facilitating the handling of the XY table actuator.

REFERENCE NUMERALS

1 . . . XY table actuator, 2 . . . stationary plate, 4 . . . intermediate plate, 5 . . . moving plate, 6 . . . X-drive means, 7 . . . Y-drive means, 20 . . . receiving groove, 21, 51 . . . rail body, 22 . . . connecting bottom plate, 40, 41 . . . receiving chamber, 52 . . . connection top plate

BEST MODES FOR CARRYING OUT THE INVENTION

In the following, the XY table actuator of the present invention is described in detail with reference to the accompanying drawings.

Figure 1:
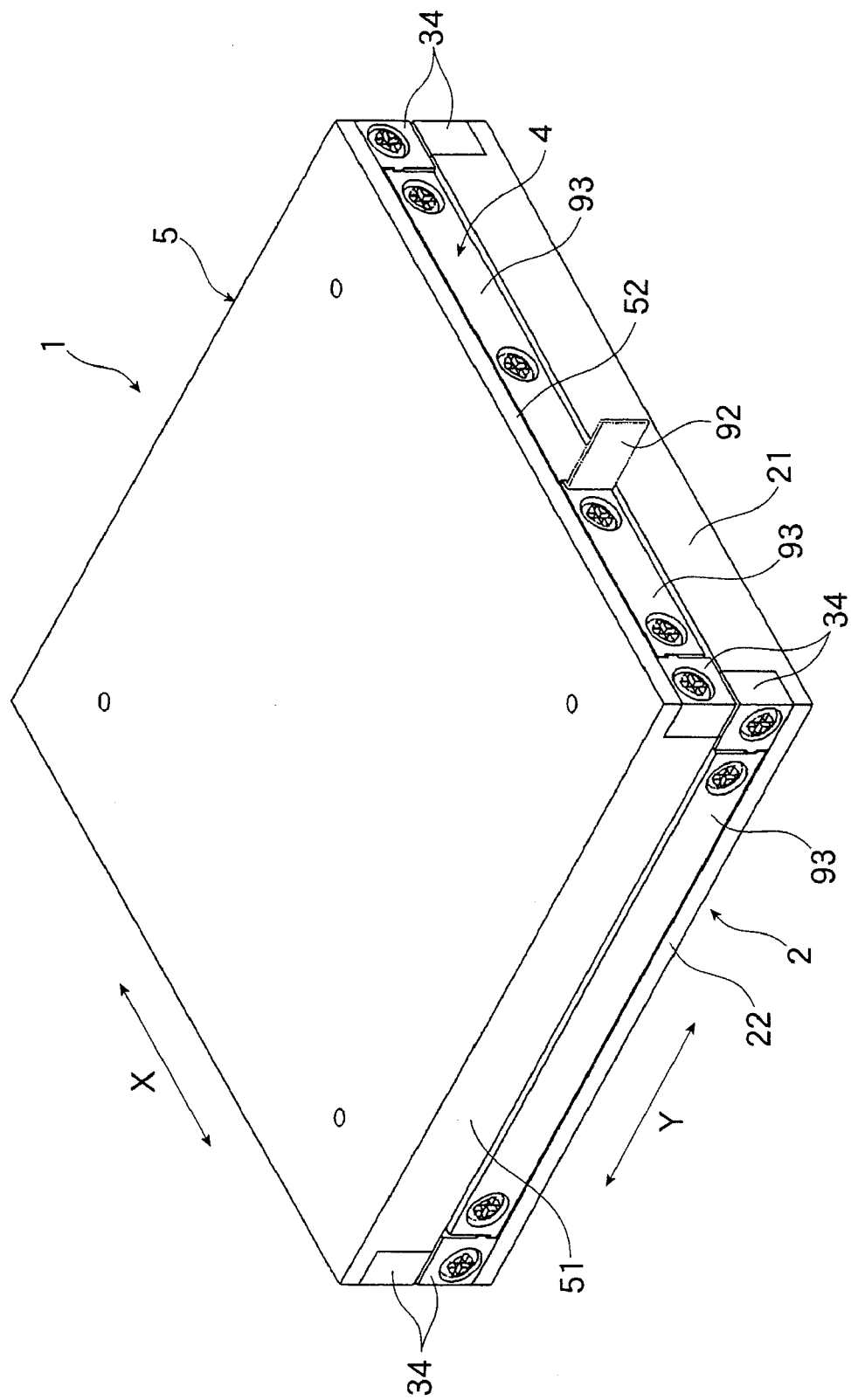
[FIG. 1] A perspective view of an XY table actuator according to a first embodiment of the present invention.
Figure 2:
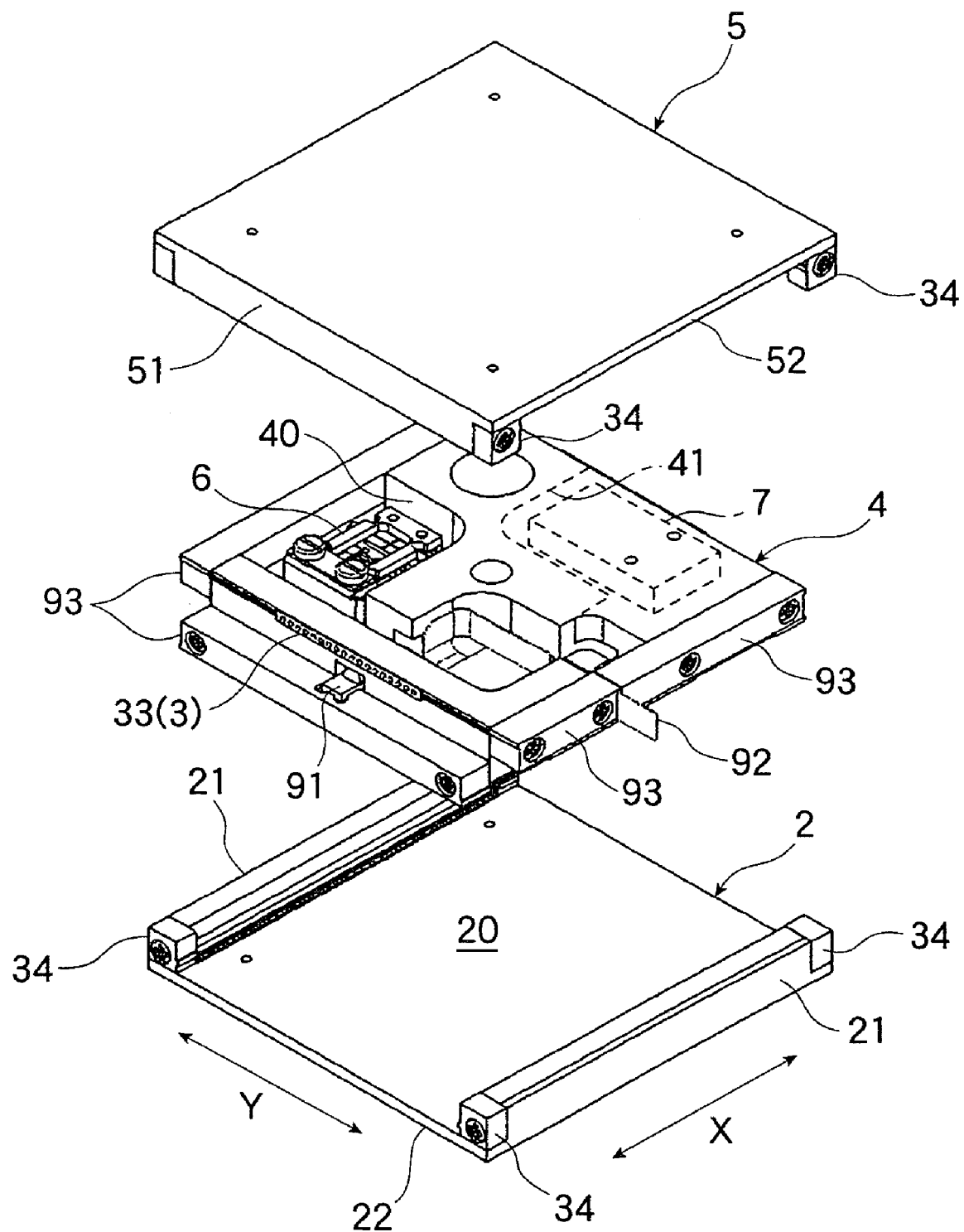
[FIG. 2] An exploded perspective view of the XY table actuator shown in FIG. 1.

FIGS. 1 and 2 show an XY table actuator according to a first embodiment of the present invention; FIG. 1 is an external perspective view, and FIG. 2 is an exploded perspective view illustrating the inner structure thereof. An XY table actuator 1 includes a stationary plate 2 to be fixed to a stationary portion such as a casing or a bed of an apparatus, an intermediate plate 4 assembled to the stationary plate 2 through the intermediation of a large number of balls 3, a moving plate 5 assembled to the intermediate plate 4 through the intermediation of a large number of balls 3, an X-drive means 6 for causing the intermediate plate 4 to advance and retreat with respect to the stationary plate 2, and a Y-drive means 7 for causing the moving plate 5 to advance and retreat with respect to the intermediate plate 4.

The intermediate plate 4 is provided so as to be movable in the X-direction with respect to the stationary plate 2, and the moving plate 5 is provided so as to be movable in the Y-direction with respect to the intermediate plate 4. Thus, by fixing a movable body such as an inspection stage or a conveyance table to the moving plate 5, it is possible to move this movable body freely in the X-direction and the Y-direction with respect to the stationary portion.

Figure 3:
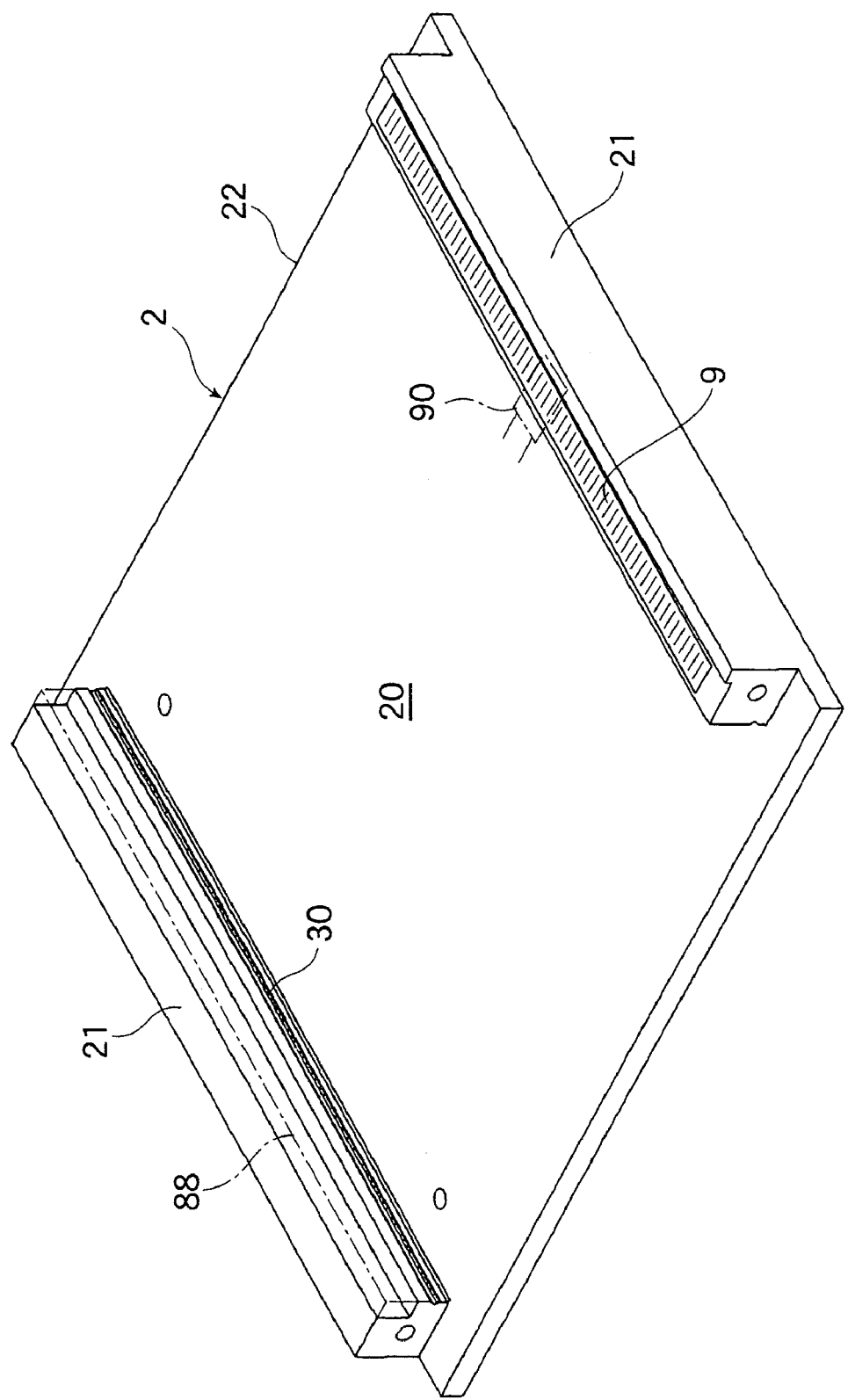
[FIG. 3] A perspective view of a stationary plate.

FIG. 3 is a perspective view of the stationary plate 2. The stationary plate 2 is formed by performing working on a rectangular metal plate having a thickness of approximately 4 mm; at the center of the upper surface thereof, there is formed a receiving groove 20 extending in the X-direction and having a width slightly larger than the width of the intermediate plate 4. Both ends of the receiving groove 20 in the X-direction are open, whereby the section of the stationary plate 2 taken in the Y-direction is substantially of a channel-like configuration. Further, the stationary plate 2 is equipped with a pair of rail bodies 21, 21 of a substantially rectangular sectional configuration formed on both sides of the receiving groove 20, and the pair of rail bodies 21, 21 are connected together by a connecting bottom plate 22 of a width corresponding to the width of the receiving groove 20.

On the other hand, the moving plate 5 is formed in completely the same configuration as the stationary plate 2; however, for being combined with the intermediate plate, it is reversed upside down; further, a receiving groove situated between a pair of rail bodies 51, 51 is formed so as to extend not in the X-direction but in the Y-direction. Thus, it is possible to use one of a pair of members formed in the same configuration as the stationary plate, and the other as the moving plate. In the moving plate, a connection top plate 52 connecting the pair of rail bodies 51, 51 forms a mounting surface for the movable body constituting the object of conveyance.

Rolling grooves 30 for the balls 3 are formed in the inner side surfaces of the rail bodies 21, 51 of the stationary plate 2 and the moving plate 5. The ball rolling grooves 30 of the stationary plate 2 are formed so as to extend in the X-direction, and the ball rolling groove 30 of the moving plate 5 are formed so as to extend in the Y-direction. Those ball rolling grooves 30 exhibit a so-called Gothic-arch-like sectional configuration in which two ball rolling surfaces cross each other at approximately 90 degrees.

Figure 4:
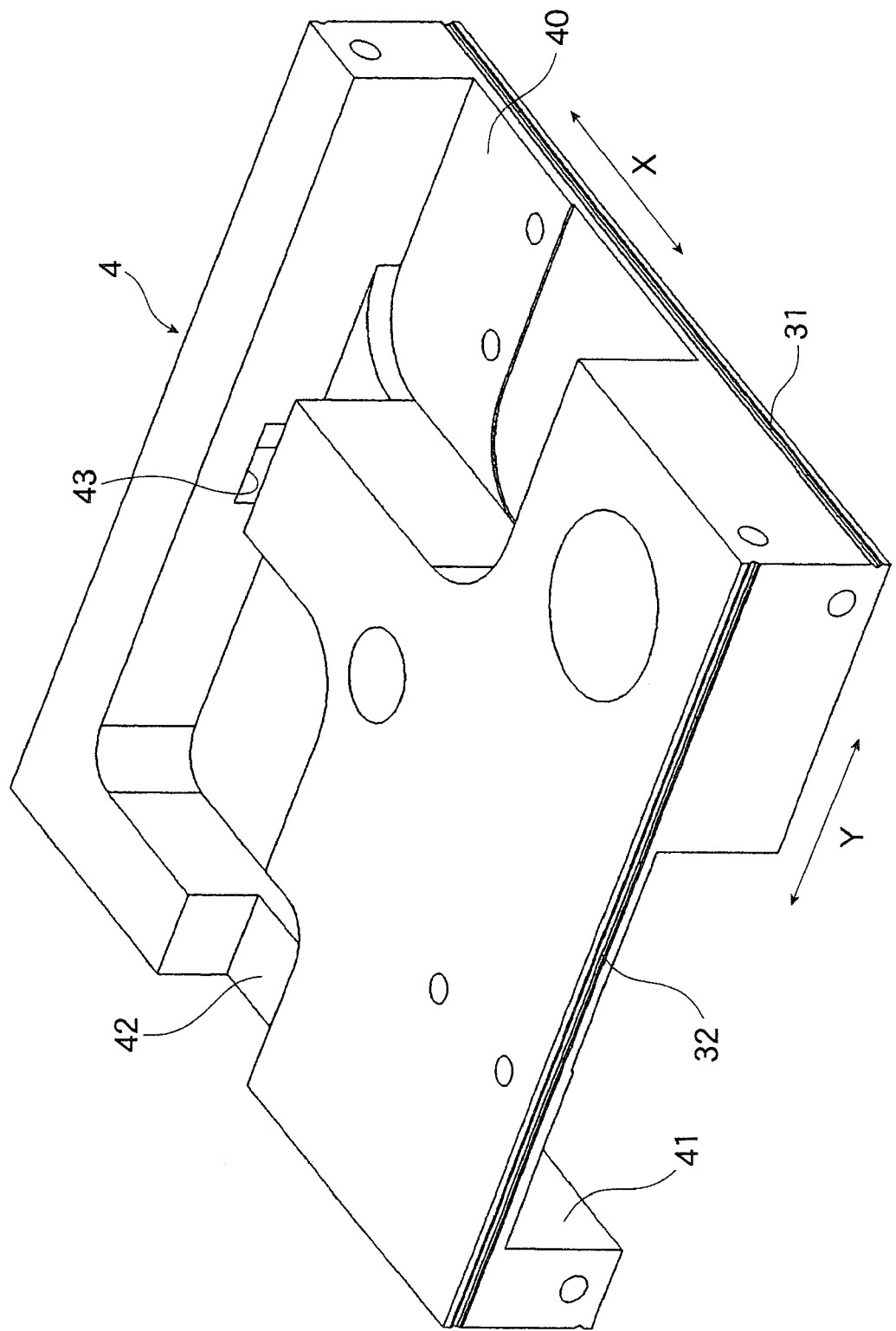
[FIG. 4] A perspective view of an intermediate plate.

On the other hand, as shown in FIG. 4, the intermediate plate 4 is formed as a rectangular plate whose thickness is approximately double the height of the rail bodies 21, 51 of the stationary plate 2 and the moving plate 5; its lower body is loosely fitted into the receiving groove 20 of the stationary plate 2, and its upper body is loosely fitted into the receiving groove of the moving plate 5. At the positions of the side surfaces of the lower body of the intermediate plate 4 opposed to the ball rolling grooves 30 of the stationary plate 2, there are formed ball rolling grooves 31 extending in the X-direction, and a large number of balls 3 are arranged between the ball rolling grooves 30 of the stationary plate 2 and the ball rolling grooves 31 of the intermediate plate 4. Similarly, at the positions of the side surfaces of the upper body of the intermediate plate 4 opposed to the ball rolling grooves 30 of the moving plate 5, there are formed ball rolling grooves 32 extending in the Y-direction, and a large number of balls 3 are arranged between the ball rolling grooves 30 of the moving plate 5 and the ball rolling grooves 32 of the intermediate plate 4. The length in the X-direction of the ball rolling grooves 31 is the same as the length in the X-direction of the stationary plate 2, and the length in the Y-direction of the ball rolling grooves 32 is the same as the length in the Y-direction of the moving plate 5.

Each of the four ball rolling grooves 31, 32 formed in the intermediate plate 4 has a so-called Gothic-arch-like sectional configuration in which two ball rolling surfaces cross each other at approximately 90 degrees. The balls 3 roll while bearing load between the ball rolling grooves 30 of the stationary plate 2 or the moving plate 5 and the ball rolling grooves 31, 32 of the intermediate plate 4. A group of balls 3 rolling in the same ball rolling groove are arranged at predetermined intervals in a thin-plate-like ball cage 33, thereby being rotatably held by the ball cage 33. The ball cages 33 may be formed by stamping of thin metal plates, injection molding of a synthetic resin, etc.

To the longitudinal ends of the rail bodies 21, 51 formed on the stationary plate 2 and the moving plate 5, stopper blocks 34 of the ball cages 33 are fixed by screws. As a result, when the moving plate 5 is continuously moved in the X-direction or the Y-direction with respect to the stationary plate 2, the ball cages 33 move together with the balls 3, and abut the stopper blocks 34, whereby the movement of the moving plate 5 in that direction is restricted.

In forming the stationary plate 2 and the moving plate 5, the receiving grooves are formed by cutting in rectangular metal plates of a thickness of approximately 4 mm by means of a milling machine or the like, then the ball rolling grooves 30 are formed by grinding in the rail bodies 21, 51. Instead of forming the receiving grooves in metal plates by cutting, it is also possible to produce the stationary plate 2 and the moving plate 5 of a channel-like configuration by metal injection molding (MIM molding).

On the other hand, the intermediate plate 4 has receiving chambers 40, 41 for fixing the X-drive means 6 and the Y-drive means 7 in position. The receiving chamber 40 for the X-drive means 6 is formed as a recess open on the moving plate 5 side surface of the intermediate plate 4; the receiving chamber 40 is also open toward one rail body 21 of the stationary plate 2. The receiving chamber 40 is adjacent to the ball rolling groove 31 formed in the intermediate plate 4 to extend in the X-direction.

The receiving chamber 41 for the Y-drive means 7 is formed as a recess open on the stationary plate 2 side surface of the intermediate plate 4; the receiving chamber 41 is also open toward one rail body 51 of the moving plate 5. The receiving chamber 41 is adjacent to the ball rolling groove 32 formed in the intermediate plate 4 to extend in the Y-direction.

The positional relationship between the receiving chamber 40 to which the X-drive means 6 is fixed and the receiving chamber 41 to which the Y-drive means 7 is fixed is such that they are adjacent to each other in the XY-plane and do not overlap each other in the thickness direction of the intermediate plate 4, that is, the direction in which the stationary plate 2, the intermediate plate 4, and the moving plate 5 are stacked together.

Figure 5:
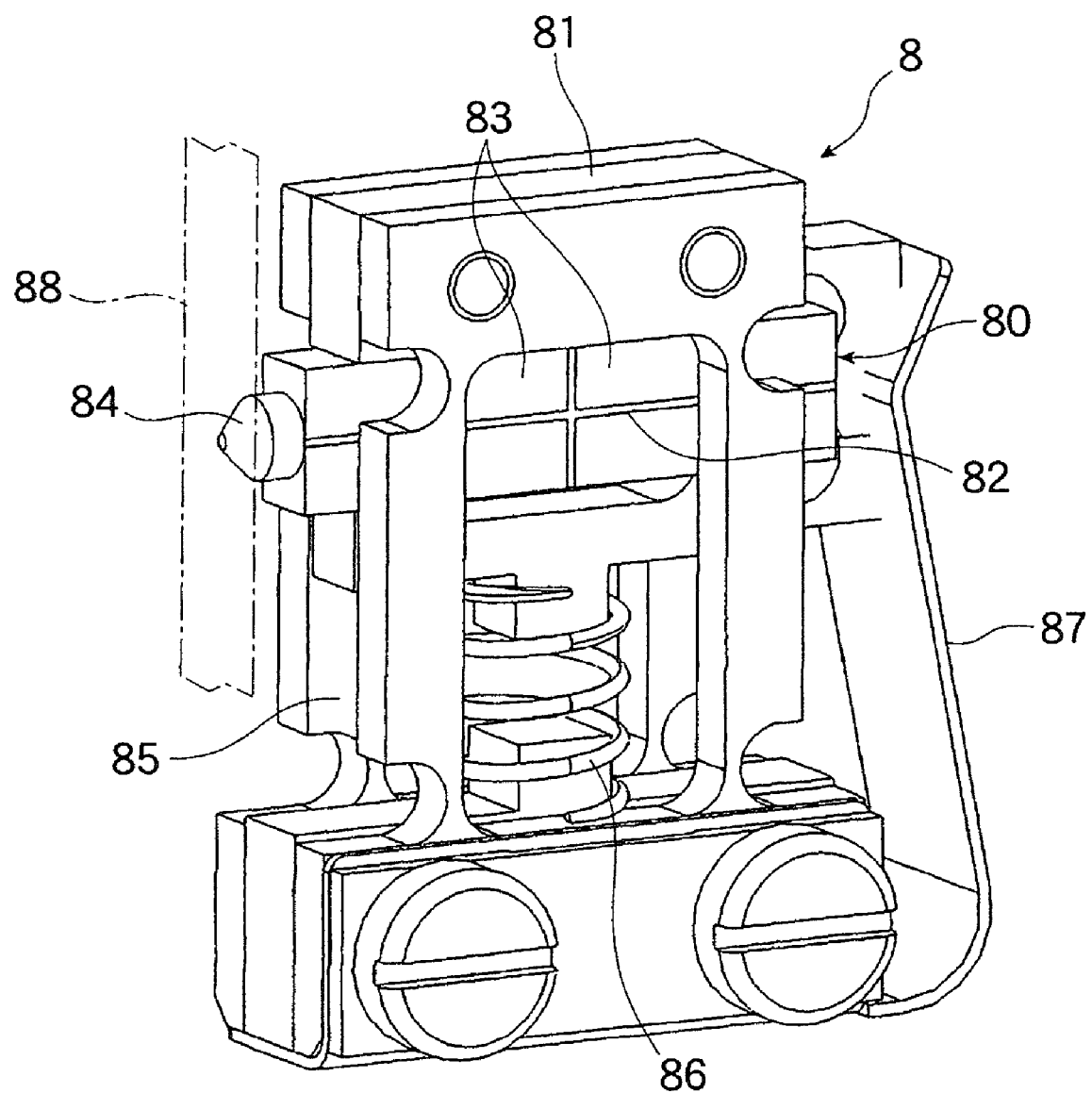
[FIG. 5] A perspective view of a piezoelectric motor unit serving as a drive means.

FIG. 5 is a perspective view of a piezoelectric motor unit 8 used as the X-drive means 6 and the Y-drive means 7. The piezoelectric motor unit 8 includes a piezoelectric motor 80 formed by laminating together piezoelectric ceramic members, and a holder 81 which holds the piezoelectric motor 80 and which is fixed to the intermediate plate 4 by screws. In the piezoelectric motor 80, four piezoelectric ceramic members 83 are put together through the intermediation of a cross-shaped insulating sheet 82, thereby forming a bimorph cell. A ceramic drive top 84 whose forward end is conical is attached to one longitudinal end of the piezoelectric motor 80. In the piezoelectric motor 80, the timing with which voltage is applied to the four piezoelectric ceramic members 83 is adjusted, whereby the bimorph cell, which is formed by putting together the four piezoelectric members 83, is repeatedly expanded and bent, and the forward end of the drive top 84 moves so as to draw an elliptical path.

The holder 81 has a slit 85 into which the piezoelectric motor 80 is loosely fitted; the piezoelectric motor 80 is urged in one direction within the slit 85 by a spring coil 86, and is held at a fixed position within the slit 85. This construction is adopted so as not to hinder the expansion and bending of the piezoelectric motor 80. Further, the piezoelectric motor 80 is urged from behind by a plate spring 87, and the drive top 84 attached to the forward end is pressed against a traveling path 88 provided on the moving plate 5 or the stationary plate 2.

The piezoelectric motor 8 thus constructed is accommodated in the receiving chamber 40, 41 as the X-drive means 6 or the Y-drive means 7, and is fastened to the intermediate plate 4 by a fixation bolt 89. The piezoelectric motor unit 8 serving as the X-drive means 6 is fixed to the intermediate plate 4, with the drive top 84 at the forward end of the piezoelectric motor 80 being directed toward the rail body 21 of the stationary plate 2. The piezoelectric motor unit 8 serving as the Y-drive means 7 is fixed to the intermediate plate 4, with the drive top 84 at the forward end of the piezoelectric motor 80 being directed toward the rail body 51 of the moving plate 5.

As indicated by the alternate long and short dash lines in FIG. 3, of the pair of rail bodies 21 formed on the stationary plate 2, the traveling path 88 for the piezoelectric motor 80 is attached to the rail body 21 opposed to the receiving chamber 40 of the intermediate plate 4. The traveling path 88 is a rectangular bar formed of a ceramic material, and is mounted to the inner side surface of the rail body 21 so as to be parallel to the ball rolling groove 30; it is opposed to the drive top 84 of the piezoelectric motor unit 8 (X-drive means 6) fixed to the receiving chamber 40 of the intermediate plate 4. While it is also possible to use the rail body 21 itself as the traveling path for the drive top 84 instead of mounting the ceramic traveling path 88 to the rail body 21, since the drive top 84 is formed of a ceramic material, and from the viewpoint of preventing wear of the rail body 21, the traveling path 88 formed of the same material as that of the drive top 84 is attached to the rail body 21.

Similarly, a traveling path formed of a ceramic material is attached to the rail body 51 of the moving plate 5. This traveling path is mounted to the inner side surface of the rail body 51 so as to be parallel to the ball rolling groove 330, and is opposed to the drive top 84 of the piezoelectric motor unit 8 (Y-drive means 7) fixed to the receiving chamber 41 of the intermediate plate 4.

As described above, each piezoelectric motor 80 is urged from behind by the plate spring 87, so the drive top 84 attached to the forward end of each piezoelectric motor 80 is held in press contact with the traveling path 88 of the stationary plate 2 or the traveling path 88 of the moving plate 5. As a result, when voltage is applied to the piezoelectric motors 80, each drive top 84 is repeatedly brought into and out of contact with the traveling path while drawing an elliptical path; by virtue of the X-drive means 6, it is possible to propel the intermediate plate 4 in the X-direction with respect to the stationary plate 2. By virtue of the Y-drive means 7, it is possible to propel the moving plate 5 in the Y-direction with respect to the intermediate plate 4.

Further, as shown in FIG. 3, a linear scale 9 is affixed to the stationary plate. The linear scale 9, which extends in the X-direction, is affixed to the upper surface of the rail body 21 on the side opposite to the rail body 21 to which the traveling path 88 is attached. On the other hand, an X-direction sensor 90 serving as an encoder is provided on the intermediate plate 4 at a position opposed to the linear scale 9; in accordance with the movement of the intermediate plate 4 with respect to the stationary plate 2, the X-direction sensor 90 reads the linear scale 9, and outputs a signal corresponding to the speed and distance of the movement in the X-direction of the intermediate plate 4.

Also regarding the moving plate 5, a linear scale which extends in the Y-direction is affixed to the rail body 51 on the side opposite to the rail body 51 to which the traveling path is attached. The intermediate plate 4 is provided with a Y-direction sensor 91 (see FIG. 2) as an encoder at a position opposed to the linear scale 4; in accordance with the movement of the moving plate 5 with respect to the intermediate plate 5, the Y-direction sensor 91 reads the linear scale, and outputs a signal corresponding to the speed and distance of the movement in the Y-direction of the moving plate 5. While in the relationship between the stationary plate 2 and the intermediate plate 4 the X-direction sensor 90 moves with respect to the linear scale 9 together with the intermediate plate 4, in the relationship between the intermediate plate 4 and the moving plate 5, the linear scale affixed to the moving plate 5 moves with respect to the Y-direction sensor 91 fixed to the intermediate plate 4.

The combination of the linear scale and the sensor for reading this may be of an optical type or a magnetic type.

The intermediate plate 4 is provided with recesses 42, 43 for mounting the X-direction sensor and the Y-direction sensor. The recess 42 for fixing the X-direction sensor 90 is provided on the side opposite to the X-drive means 6, and the recess 43 for fixing the Y-direction sensor 91 is provided on the side opposite to the Y-drive means 7. The X-direction sensor 90 is provided at the center in the X-direction length of the intermediate plate 4, and the Y-direction sensor 91 is provided at the center in the Y-direction length of the intermediate plate 4, making it possible to measure in a maximum range the advancement and retreat in the X-direction of the intermediate plate 4 and the advancement and retreat in the Y-direction of the moving plate 5.

The signal lines for applying voltage to the piezoelectric motors 80 of the X-drive means 6 and the Y-drive means 7 and the signal lines of the X-direction sensor 90 and the Y-direction sensor 91 are collectively led out of the intermediate plate 4. Those signal lines are accommodated in a single flexible printed circuit board (FPC), and an FPC 92 in the form of a strip is led out of the intermediate plate 4. The FPC 92 thus led out is connected to a control box (not shown) for controlling the operation of the XY table actuator 1.

The surface of the strip-shaped FPC 92 led out of the intermediate plate 4 is directed in the direction of movement of the intermediate plate 4 with respect to the stationary plate 2, that is, in the X-direction, and can be freely deflected when the intermediate plate 4 moves in the X-direction. Depending upon the position at which it is led out of the intermediate plate 4, the FPC 92 may be arranged such that its surface is directed in the Y-direction.

In FIG. 2, reference numeral 93 indicates clearance blocks for filling the clearances between the rail bodies 21 of the stationary plate 2 and the connection top plate 52 of the moving plate 5 and the clearances between the rail bodies 51 of the moving plate 5 and the connecting bottom plate 22 of the stationary plate 2; the clearance blocks are fixed to the side surfaces of the intermediate plate 4.

In the XY table actuator 1 constructed as described above, the lower body of the intermediate plate 4 is accommodated in the receiving groove 20 of the stationary plate 2, and the upper body thereof is accommodated in the receiving groove of the moving plate 5, so the XY table actuator exhibits a very small and thin outward appearance, with the moving plate 5 being simply superimposed on the stationary plate 2 through the intermediation of a slight gap. However, the X-drive means 6 for causing the intermediate plate 4 to advance and retreat in the X-direction and the Y-drive means 7 for causing the moving plate 5 to advance and retreat in the Y-direction with respect to the intermediate plate 4 are both built in the intermediate plate 4, and, solely by connecting the FPC 92 led out to the control box, it is possible to freely move the moving plate 5 within the XY-plane with respect to the stationary plate 2, effecting positioning thereon at an arbitrary position.

Further, the receiving chamber 40 for the X-drive means 6 and the receiving chamber 41 for the Y-drive means 7 provided in the intermediate plate 4 are adjacent to each other within the XY-plane, and do not overlap each other in the height direction of the XY table actuator 1, which also helps to suppress an increase in height of the entire table and to provided a thin XY table actuator 1.

Further, since the mounting positions for the X-direction and Y-direction drive means 6, 7 and the sensors 90, 91 are concentrated on the intermediate plate 4, it is possible to collectively lead the various signal lines out of the intermediate plate 4, thus facilitating the handling of the XY table actuator 1.

Further, the FPC can be formed in a number of layers, so, by accommodating the various signal lines in the FPC 92 and leading them out of the intermediate plate 4, it is possible for the line connecting the intermediate plate 4 to the control box to be thin and narrow, which also contributes to a reduction in size and thickness of the XY table actuator 1.

Figure 6:
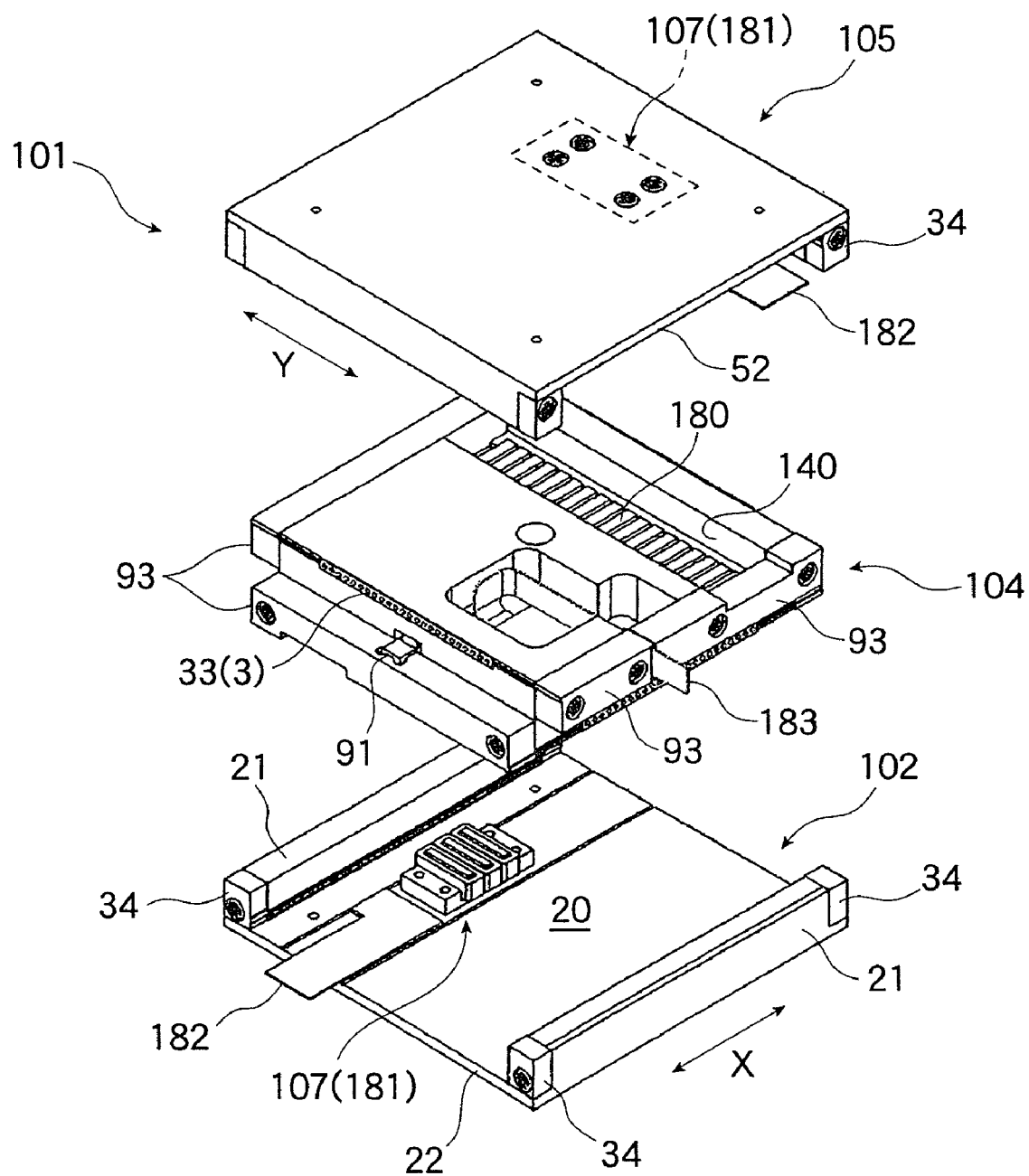
[FIG. 6] An exploded perspective view of an XY table actuator according to a second embodiment of the present invention.

Next, FIG. 6 shows an XY table actuator 101 according to a second embodiment of the present invention.

Like the XY table actuator 1 of the first embodiment, the XY table actuator 101 of the second embodiment is equipped with a stationary plate 102, an intermediate plate 104, a moving plate 105, an X-drive means 106, and a Y-drive means 107, with the moving plate 105 being moved freely in the XY-directions. Instead of the piezoelectric motors 80 of the first embodiment, synchronous type linear motors are used as the X-drive means 106 and the Y-drive means 107. The requisite change allowing the use of the synchronous type linear motors is effected on the stationary plate 102, the intermediate plate 104, and the moving plate 105. Thus, the components that are the same as those of the first embodiment are indicated by the same reference numerals, and a description thereof is omitted.

Each of the linear motors used as the X-drive means 106 and the Y-drive means 107 includes a plurality of stator magnets 180 arranged in a row and a coil member 181 opposed to the stator magnets 180 through the intermediation of a slight gap.

The stator magnets 180 are arranged such that their N-poles and S-poles are alternately directed toward the coil member 181. The stator magnets 180 are arranged on a holding plate of synthetic resin; by gluing the holding plate to the intermediate plate 104, the arrangement of the stator magnets 180 on the intermediate plate 104 is facilitated. Further, the stator magnets 180 are integrated with the holding plate through injection molding of the holding plate.

The coil member 181 is formed by winding a coil around a core member formed of a ferromagnetic material such as iron; the forward end of the core member is opposed to the stator magnets 180 through the intermediation of a slight gap. The coil is of three phases: u-phase, v-phase, and w-phase; when a three-phase alternating current is supplied to the coil, a magnetic attracting force or a magnetic repulsive force is exerted between the stator magnets 180 and the coil member 181, and it is possible to propel the coil member 181 in the direction in which the stator magnets 180 are arranged.

In this linear motor, the stator magnets 180 are fixed to the intermediate plate 104, and the coil members 181 are fixed to the stationary plate 102 and the moving plate 105, respectively.

Figure 7:
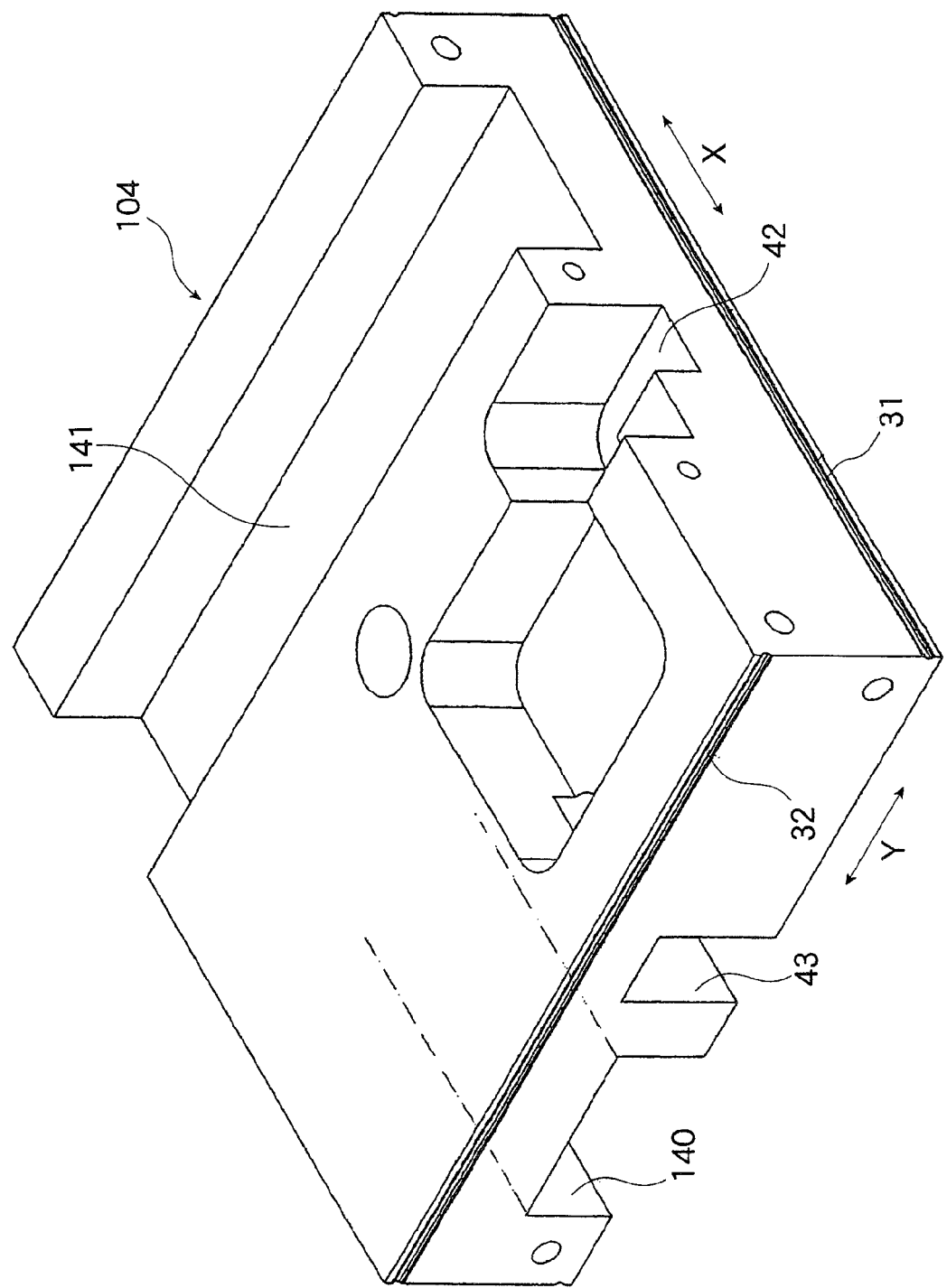
[FIG. 7] A perspective view of an intermediate plate.

FIG. 7 is a detailed perspective view of the intermediate plate 104. A receiving chamber 141 for the Y-drive means 107 is formed in the moving plate 105 side surface of the intermediate plate 104. The receiving chamber 141 is formed as a groove extending in the Y-direction, with both longitudinal ends of the groove being open in the side surfaces of the intermediate plate 104. As shown in FIG. 6, the stator magnets 180 are fixed by adhesion to the bottom surface of the receiving chamber 141 together with the holding plate. On the other hand, the coil member 181 is fixed to the back surface of the moving plate 105 at a position opposed to the receiving chamber 141; when the moving plate 105 is assembled to the intermediate plate 104, the coil member 181 is opposed to the stator magnets 180 within the receiving chamber 141 through the intermediation of a slight gap, thus forming the Y-drive means 107.

On the other hand, a receiving chamber 140 for the X-drive means 106 is formed in the stationary plate 102 side surface of the intermediate plate 104. The receiving chamber 140 is formed as a groove extending in the X-direction, with both longitudinal ends of the groove being open in the side surfaces of the intermediate plate 104. Further, the receiving chamber 140 crosses the receiving chamber 141; in the crossing region, the receiving chamber 140 and the receiving chamber 141 overlap each other in the thickness direction of the intermediate plate. As in the case of the receiving chamber 141, the stator magnets 180 are glued to the bottom surface of the receiving chamber 140 together with the holding plate. On the other hand, the coil member 181 is fixed to the stationary plate 102 at a position opposed to the receiving chamber 140; when the intermediate plate 104 is assembled to the stationary plate 102, the coil member 181 is opposed to the stator magnets 180 within the receiving chamber 140 through the intermediation of a slight gap, thus forming the X-drive means 106.

Signal lines are led out of the coil members 181 of the X-drive means 106 and the Y-drive means 107 by the FPCs 182, and electricity supply to the coil members 181 is effected through those signal lines. By using the FPCs 182 as the signal lines, it is possible to easily lead the signal lines out of the gap between the stationary plate 102 and the intermediate plate 104 and the gap between the intermediate plate 104 and the moving plate 105.

Further, the means for detecting the moving distance or the moving speed in the X-direction of the intermediate plate 104 with respect to the stationary plate 102, and the means for detecting the moving distance in the Y-direction of the moving plate 105 with respect to the intermediate plate 104 are the same as those of the first embodiment, and the signal lines of the X-direction sensor and the Y-direction sensor are led out of the intermediate plate 104 by an FPC 183.

Also in the XY table actuator 1 of the second embodiment, which is constructed as described above, the lower body of the intermediate plate 104 is accommodated in the receiving groove 20 of the stationary plate 102, and the upper body thereof is accommodated in the receiving groove of the moving plate 105, so the XY table actuator is very small and thin in outward appearance, with the moving plate 105 being simply stacked on the stationary plate 102 through the intermediation of a slight gap. However, the X-drive means 106 for causing the intermediate plate 104 to advance and retreat in the X-direction, and the Y-drive means 107 for causing the intermediate plate 104 to advance and retreat in the Y-direction are both accommodated in the receiving chambers of the intermediate plate, making it possible to move the moving plate 105 freely within the XY-plane with respect to the stationary plate 102 and to effect positioning thereon at an arbitrary position.

Further, in the second embodiment, if the coil members 181 of the linear motor are fixed to the receiving chambers 140, 141 of the intermediate plate 104, and the stator magnets 180 are fixed to the stationary plate 102 or the moving plate 105, there is no change in the thickness of the intermediate plate 104, thus making it possible to form an XY table actuator 101 of the same height. However, in the second embodiment, the coil members 181 of the linear motor are intentionally fixed to the stationary plate 12 or the moving plate 105. That is, when supplied with electricity, the coil members 181 generate a great amount of heat, so, when they are fixed to the intermediate plate 104, which is held between the stationary plate 102 and the moving plate 105, the cooling of the coil members 181 is not promoted, resulting in a reduction in thrust of the linear motor.

Thus, in the second embodiment, it is possible to dissipate the heat generated by the coil members 181 of the linear motors to the exterior via the stationary plate 102 or the moving plate 105, making it possible to prevent a reduction in thrust of the X-drive means 106 and of the Y-drive means 107.

While in the example described with reference to the drawings balls are used as the rolling members provided between the stationary plate 2 and the intermediate plate 4 and between the intermediate plate 4 and the moving plate 5, it is also possible to use rollers as the rolling members. In the case in which rollers are used, it is possible to adopt a so-called cross-roller-type structure in which rollers differing in rotation axis direction by 90 degrees are alternately arranged.

Figure 8:
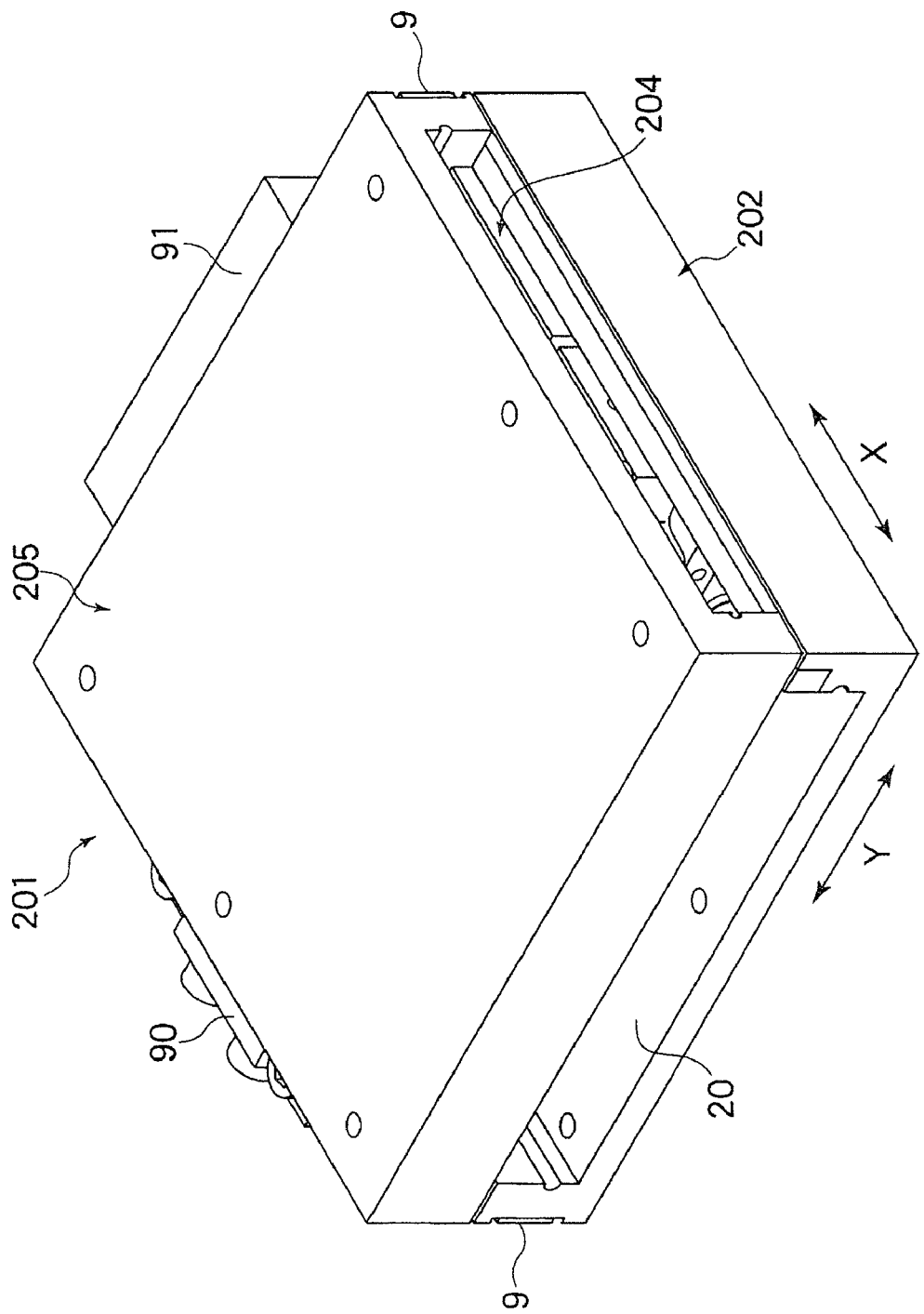
[FIG. 8] A perspective view of an XY table actuator according to a third embodiment of the present invention.

FIG. 8 is a perspective view of an XY table actuator 201 according to the third embodiment of the present invention.

Figure 9:
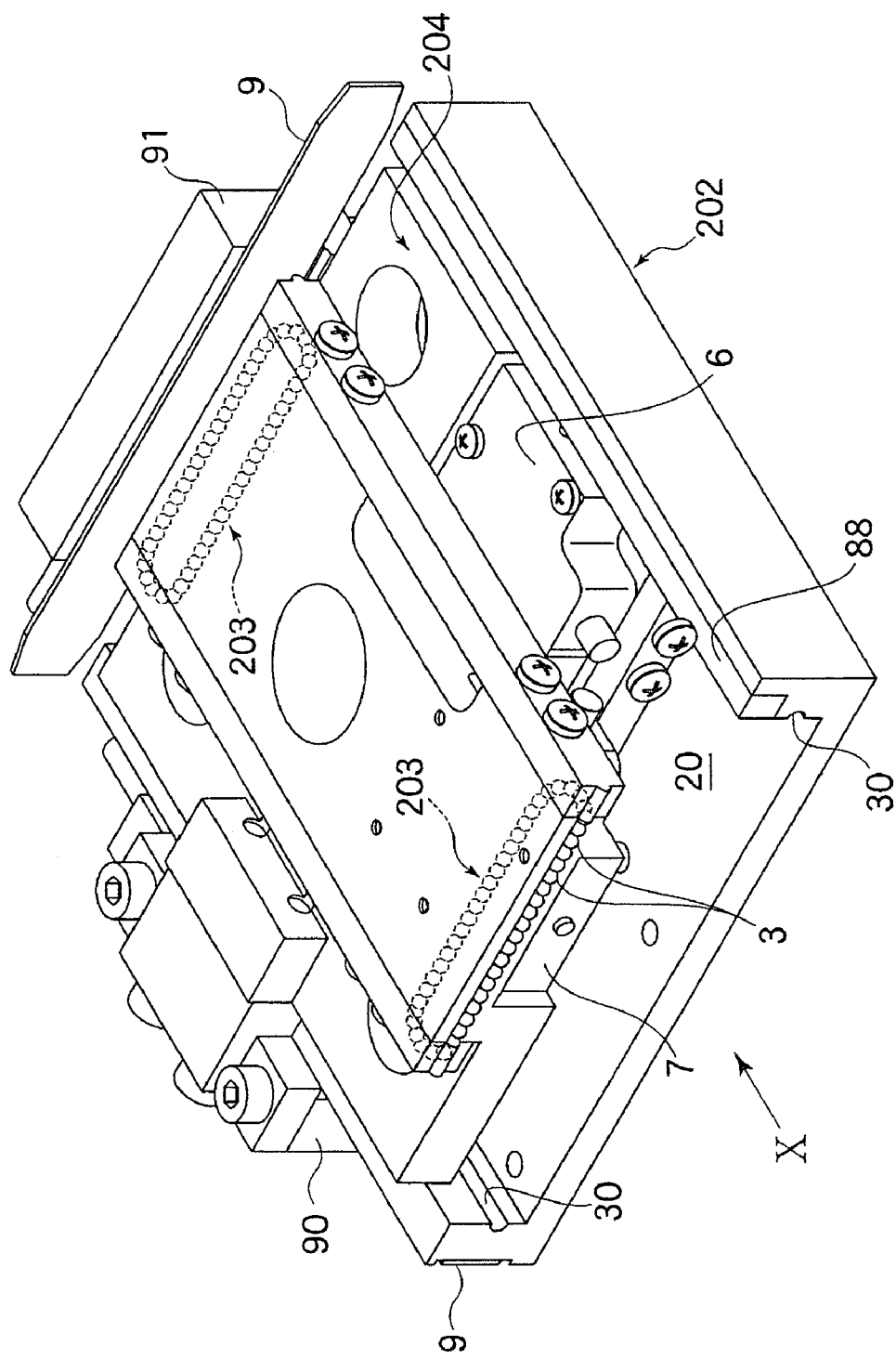
[FIG. 9] A perspective view of the XY table actuator shown in FIG. 8 with the moving plate removed therefrom.
Figure 10:
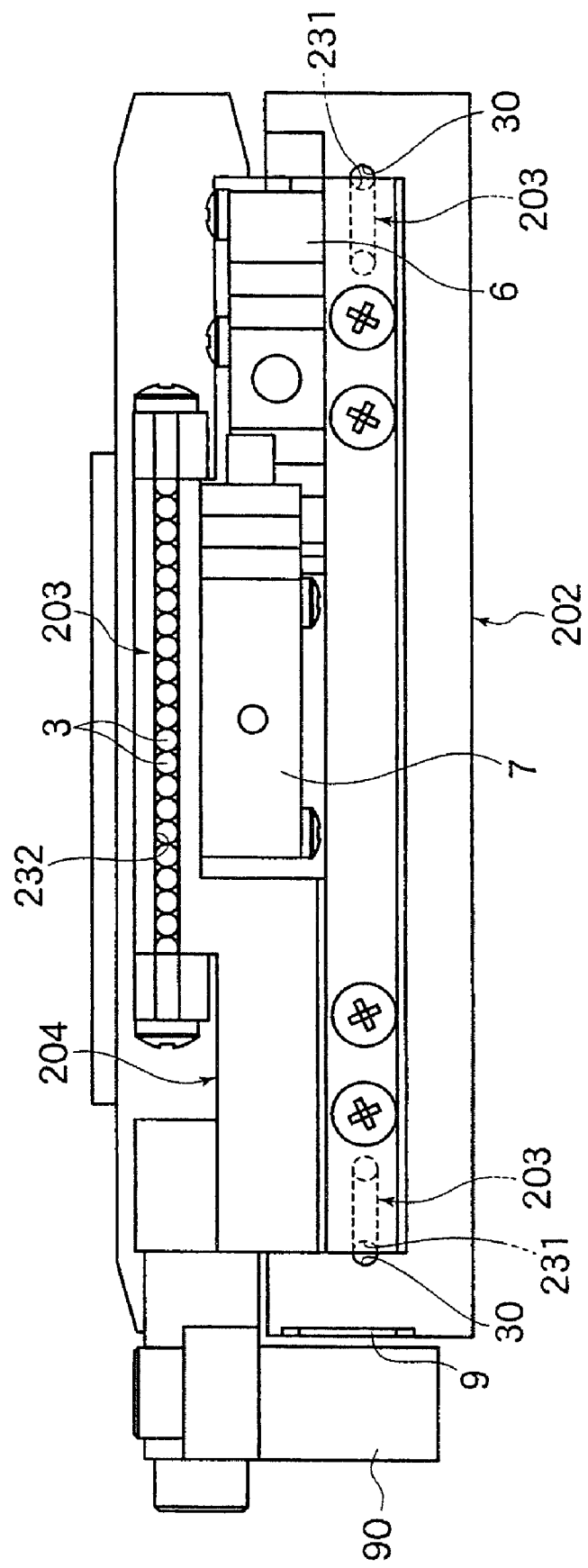
[FIG. 10] A view taken in the direction of the arrow X of FIG. 9.

The XY table actuator 201 also includes a stationary plate 202 to be fixed to a stationary portion such as a casing or a bed of a mechanical apparatus, an intermediate plate 204 assembled to the stationary plate 202 through the intermediation of a large number of balls 3, a moving plate 205 assembled to the intermediate plate 204 through the intermediation of a large number of balls 3, an X-drive means 206 for causing the intermediate plate 204 to advance and retreat with respect to the intermediate plate 204, and a Y-drive means 7 for causing the moving plate 205 to advance and retreat with respect to the intermediate plate 204. FIG. 9 is a perspective view with the moving plate 205 removed to allow observation of the inner structure. FIG. 10 is a view taken in the direction of the arrow X in FIG. 8.

The XY table actuator 201 of the third embodiment differs from the XY table actuator 1 of the first embodiment in the following two points.

The first difference lies in the fact that, taking into use in a special environment into consideration, the components are formed not of resin or metal but of a ceramic material. For example, in a vacuum environment, there is a problem in that gas is discharged from the resin material, so the degree of vacuum is not easily improved to the target level. In an electron beam drawing apparatus used for the production of semiconductors, the components of the XY table actuator must be formed of a non-magnetic material so as to avoid inadvertent deflection of the electron beam.

Thus, in the XY table actuator 201 of the third embodiment, the stationary plate 202, the intermediate plate 204, and the moving plate 205 are formed of a ceramic material. Further, the various components, screws, etc. attached to those plates are also formed of a ceramic material. The balls 3, which roll while bearing load between the plates, are also ceramic balls. Further, to avoid lubrication of the ball surfaces by lubricant such as grease, the surface of each of the balls is covered with a solid lubricant film of molybdenum disulfide, graphite, or the like.

The second difference lies in the fact that endless tracks for the balls 3 are formed in the intermediate plate 204. In the XY table actuator 1 of the first embodiment, from the viewpoint of the relationship between the stationary plate 2 and the intermediate plate 4, the balls 3 are arranged between the ball rolling grooves 30 of the stationary plate 2 and the ball rolling grooves 31 of the intermediate plate 4 together with the ball cages 33; in accordance with the movement of the intermediate plate 4 with respect to the stationary plate 2, the balls 3 roll on the ball rolling grooves 30, 31. However, the balls 3 are not incomplete rolling contact with the ball rolling grooves 30, 31 but are slightly in sliding contact therewith, so, when the intermediate plate 4 repeatedly reciprocates with respect to the stationary plate 2, the positions of the balls 3 with respect to the ball rolling grooves 30, 31 are gradually deviated. That is, while in the state in which the stationary plate 2 and the intermediate plate 4 completely overlap each other the ball cage 33 exist at the center in the width direction of the stationary plate 2, as the intermediate plate 4 repeats its movement, the ball cages 33 are deviated toward the end of the ball rolling grooves 30, 31. This phenomenon is referred to as cage deviation. This phenomenon of cage deviation also occurs to the balls 3 existing between the intermediate plate 4 and the moving plate 5.

It might be possible to correct cage deviation by forcibly moving the intermediate plate 4 with respect to the stationary plate 2, with the ball cages 33 abutting the stopper blocks 34. That, however, would entail the following problem: the balls 3 would have to be forcibly dragged with respect to the ball rolling grooves 30, 31; thus, when the surface of each of the balls 3 is covered with a solid lubricant film, the solid lubricant film is subject to separation. If the movement of the intermediate plate is repeated with the solid lubricant film separated, dust is generated due to wear of the balls, so it is impossible to use this XY table actuator in a special environment such as a clean room. Further, it should be also noted that the present invention aims to provide a very small XY table actuator, so the X-drive means 6 for propelling the intermediate plate 4 with respect to the stationary plate 2 does not have large thrust, and it is also difficult to perform correction of cage deviation.

In view of this, in the XY table actuator 201 shown in FIG. 8, in order to eliminate the ball cages, the intermediate plate 204 is equipped with the endless tracks 203 for the balls 3, and as the intermediate plate 204 moves in the X-direction with respect to the stationary plate 202, and the moving plate 205 moves in the Y-direction with respect to the intermediate plate 204, the balls 3 circulate through the endless tracks. In FIG. 9, in which the moving plate 205 is removed, it is possible to observe the endless tracks 203 for the balls 3. The pair of endless tracks 203 shown in FIGS. 9 and 10 are endless tracks for the balls 3 rolling in the ball rolling grooves 30 of the moving plate 205; as the moving plate 205 moves in the Y-direction with respect to the intermediate plate 204, the balls 3 circulate through the endless tracks 203. As shown in FIG. 10, the endless tracks 203 for the balls 3 rolling in the ball rolling grooves 30 of the stationary plate 202 are formed in the lowermost portion of the intermediate plate 204 at positions opposed to the ball rolling grooves 30 of the stationary plate 202.

In the side surfaces of the intermediate plate 204 facing the ball rolling grooves 30 of the stationary plate 202, there are formed ball rolling grooves 231 constituting a part of the endless tracks and extending in the X-direction, while, in the side surfaces of the intermediate plate 205 facing the ball rolling grooves 30 of the moving plate 205, there are formed ball rolling grooves 232 constituting a part of the endless tracks and extending in the Y-direction. The length in the X-direction of the ball rolling grooves 231 formed in the intermediate plate 204 to extend in the X-direction is smaller than the length in the X-direction of the stationary plate 202, allowing the intermediate plate 204 to move in the X-direction, with the endless tracks 203 not getting out of the range of the stationary plate 202. The length in the Y-direction of the ball rolling grooves 232 formed in the intermediate plate 204 to extend in the Y-direction is smaller than the length in the Y-direction of the moving plate 205, allowing the moving plate 205 to move in the Y-direction, with the endless tracks 203 not getting out of the range of the moving plate 205. That is, in the XY actuator table of the third embodiment, the difference between the length of the ball rolling grooves 30 formed in the stationary table 202 or the moving table 205 and the length of the ball rolling grooves 231, 232 formed in the intermediate plate 204 determines the X-direction stroke amount and the Y-direction stroke amount.

In the XY table actuator of the third embodiment shown in FIGS. 8 through 10, the linear scales 9 are affixed to the outer side surfaces of the stationary plate 202 and the moving plate 205, and the X-direction sensor 90 and the Y-direction sensor 91 for reading the linear scales 9 are arranged on the outer side of the stationary plate 202 or the moving plate 205 while supported by the intermediate plate 204.

In FIGS. 8 through 10, the components that are the same as those of the first embodiment are indicated by the same reference numerals, and a detailed description thereof is omitted.

Further, also in the XY table actuator of the third embodiment, the lower body of the intermediate plate 204 is accommodated in the receiving groove 20 of the stationary plate 202, and the upper body thereof is accommodated in the receiving groove of the moving plate 205, so the XY table actuator exhibits a very small and thin appearance, with the moving plate 205 being simply stacked on the stationary plate 202 through the intermediation of a slight gap. However, the X-drive means 6 for causing the intermediate plate 204 to advance and retreat in the X-direction and the Y-drive means 7 for causing the moving plate 205 to advance and retreat in the Y-direction are both accommodated in receiving chambers of the intermediate plate 204, making it possible to move the moving plate 205 freely within the XY-plane with respect to the stationary plate 202 and to perform positioning thereon at an arbitrary position.

The invention claimed is:

1. An XY table actuator comprising: a stationary plate (2) having a receiving groove (20) extending in an X-direction and formed in a substantially channel-like configuration; a moving plate (5) having a receiving groove extending in a Y-direction and formed in a substantially channel-like configuration; an intermediateplate (4) whose lower body is assembled to the receiving groove of the stationary plate through intermediation of first rolling bodies (3), whose upper body is assembled to the receiving groove of the moving plate through intermediation of second rolling bodies (3), and which is movable in the X-direction with respect to the stationary plate, with the moving plate being movable in the Y-direction with respect to the intermediate plate; an X-drive means (6) for propelling the intermediate plate in the X-direction with respect to the stationary plate; and a Y-drive means (7) for propelling the moving plate in the Y-direction with respect to the intermediate plate, wherein the intermediate plate is provided with receiving chambers (40, 41) for the X-drive means and the Y-drive means, respectively.

2. The XY table actuator according to claim 1, wherein the X-drive means (6) and the Y-drive means (7) are mounted on the intermediate plate (4).

3. The XY table actuator according to claim 1, wherein the receiving chamber for the X-drive means (6) and the receiving chamber for the Y-drive means (7) are adjacent to each other within an XY-plane.

4. The XY table actuator according to claim 1, wherein the intermediate plate (4) has mounted thereon an X-direction sensor (90) for detecting an amount by which the intermediate plate moves with respect to the stationary plate (2) and a Y-direction sensor (91) for detecting an amount by which the intermediate plate (4) moves with respect to the moving plate (5), and wherein signal lines of the X-direction sensor (90) and the Y-direction sensor (91) are led out of the intermediate plate (4) collectively together with signal lines of the X-drive means (6) and the Y-drive means (7).

5. The XY table actuator according to claim 4, wherein the signal lines of the X-direction sensor (90), the Y-direction sensor (91), the X-drive means (6), and the Y-drive means (7) are accommodated in a single flexible printed circuit board (92) and are led out of the intermediate plate (4).

6. The XY table actuator according to claim 5, wherein the flexible printed circuit board (92) led out of the intermediate plate (4) has a face directed in the X-direction or the Y-direction.

7. The XY table actuator according to claim 1, wherein the X-drive means (6) is mounted on the stationary plate (2), and wherein the Y-drive means (7) is mounted on the moving plate (5).

8. The XY table actuator according to claim 1, wherein the intermediate plate (4) has a ball rolling groove (232) which extends in the X-direction and in which balls (3) roll while bearing load between the intermediate plate (4) and the stationary plate (2), and a ball rolling groove (232) which extends in the Y-direction and in which balls (3) roll while bearing load between the intermediate plate (4) and the moving plate (5), and is further equipped with endless tracks (203) through which the balls circulate, and wherein a length of the ball rolling groove extending in the X-direction and formed in the intermediate plate (4) is smaller than a length in the X-direction of the stationary plate (2), while a length of the ball rolling groove extending in the Y-direction and formed in the intermediate plate (4) is smaller than a length in the Y-direction of the moving plate (5).

9. The XY table actuator according to claim 8, wherein the surface of each of the balls (3) circulating through the endless track (203) is covered with a solid lubricant film.

\* \* \* \* \*

UNITED STATES PATENT AND TRADEMARK OFFICE
CERTIFICATE OF CORRECTION

PATENT NO. : 8,047,095 B2
APPLICATION NO. : 12/095971
DATED : November 1, 2011
INVENTOR(S) : Toshiyuki Aso et al.

It is certified that error appears in the above-identified patent and that said Letters Patent is hereby corrected as shown below:

IN THE CLAIMS
Please delete the reference numbers in the claims as follows:

In claim 1, Column 12, line 57, delete the reference number "(2)"

In claim 1, Column 12, line 58, delete the reference number "(20)"

In claim 1, Column 12, line 60, delete the reference number "(5)"

In claim 1, Column 12, line 62, delete the reference number "(4)"

In claim 1, Column 12, line 64, delete the reference number "(3)"

In claim 1, Column 12, line 66, delete the reference number "(3)"

In claim 1, Column 13, line 3, delete the reference number "(6)"

In claim 1, Column 13, line 5, delete the reference number "(7)"

In claim 1, Column 13, line 8, delete the reference numbers "(40, 41)"

In claim 2, Column 13, line 11, delete the reference numbers "(6)" and "(7)"

In claim 2, Column 13, line 12, delete the reference number "(4)"

In claim 3, Column 13, line 14, delete the reference number "(6)"

In claim 3, Column 13, line 15, delete the reference number "(7)"

In claim 4, Column 13, line 18, delete the reference number "(4)"

In claim 4, Column 13, line 19, delete the reference number "(90)"

IN THE CLAIMS

Signed and Sealed this
Fifteenth Day of May, 2012

David J. Kappos
*Director of the United States Patent and Trademark Office*

CERTIFICATE OF CORRECTION (continued)
U.S. Pat. No. 8,047,095 B2

Please delete the reference numbers in the claims as follows:

In claim 4, Column 13, line 20, delete the reference number "(2)"

In claim 4, Column 13, line 21, delete the reference number "(91)"

In claim 4, Column 13, line 22, delete the reference number "(4)"

In claim 4, Column 13, line 23, delete the reference number "(5)"

In claim 4, Column 13, line 24, delete the reference number "(90)"

In claim 4, Column 13, line 25, delete the reference number "(91)"

In claim 4, Column 13, line 26, delete the reference number "(4)"

In claim 4, Column 13, line 27, delete the reference numbers "(6)" and "(7)"

In claim 5, Column 13, line 29, delete the reference number "(90)"

In claim 5, Column 13, line 30, delete the reference numbers "(91)", "(6)", and "(7)"

In claim 5, Column 14, line 2, delete the reference numbers "(92)" and "(4)"

In claim 6, Column 14, line 4, delete the reference number "(92)"

In claim 6, Column 14, line 5, delete the reference number "(4)"

In claim 7, Column 14, line 8, delete the reference numbers "(6)" and "(2)"

In claim 7, Column 14, line 9, delete the reference number "(7)"

In claim 7, Column 14, line 10, delete the reference number "(5)"

In claim 8, Column 14, line 12, delete the reference numbers "(4)" and "(232)"

In claim 8, Column 14, line 13, delete the reference number "(3)"

In claim 8, Column 14, line 14, delete the reference number "(4)"

In claim 8, Column 14, line 15, delete the reference numbers "(2)" and "(232)"

In claim 8, Column 14, line 16, delete the reference number "(3)"

In claim 8, Column 14, line 17, delete the reference number "(4)"

In claim 8, Column 14, line 18, delete the reference numbers "(5)" and "(203)"

In claim 8, Column 14, line 21, delete the reference number "(4)"

IN THE CLAIMS
Please delete the reference numbers in the claims as follows:

CERTIFICATE OF CORRECTION (continued)
U.S. Pat. No. 8,047,095 B2

In claim 8, Column 14, line 23, delete the reference number "(2)"

In claim 8, Column 14, line 25, delete the reference number "(4)"

In claim 8, Column 14, line 26, delete the reference number "(5)"

In claim 9, Column 14, line 28, delete the reference number "(3)"

In claim 9, Column 14, line 29, delete the reference number "(203)"